United States Patent
Shioda et al.

(10) Patent No.: US 12,252,317 B2
(45) Date of Patent: Mar. 18, 2025

(54) BARRIER FILM AND PACKAGING MATERIAL

(71) Applicant: DAI NIPPON PRINTING CO., LTD., Tokyo (JP)

(72) Inventors: Satoshi Shioda, Tokyo (JP); Hidenari Kanetaka, Tokyo (JP); Kenta Konishi, Tokyo (JP); Masanori Sawada, Tokyo (JP); Ryunosuke Shiota, Tokyo (JP); Yoshihiro Kishimoto, Tokyo (JP); Ai Okano, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 720 days.

(21) Appl. No.: 16/972,889

(22) PCT Filed: Jun. 5, 2019

(86) PCT No.: PCT/JP2019/022271
§ 371 (c)(1),
(2) Date: Dec. 7, 2020

(87) PCT Pub. No.: WO2019/235509
PCT Pub. Date: Dec. 12, 2019

(65) Prior Publication Data
US 2021/0253322 A1    Aug. 19, 2021

(30) Foreign Application Priority Data

Jun. 7, 2018    (JP) .................................. 2018-109547

(51) Int. Cl.
| | | |
|---|---|---|
| B65D 65/42 | (2006.01) |
| B32B 7/12 | (2006.01) |
| B32B 27/08 | (2006.01) |
| B32B 27/32 | (2006.01) |
| B32B 27/34 | (2006.01) |
| B32B 27/36 | (2006.01) |
| B65D 65/40 | (2006.01) |
| C23C 14/02 | (2006.01) |
| C23C 14/08 | (2006.01) |
| C23C 14/24 | (2006.01) |

(52) U.S. Cl.
CPC .............. *B65D 65/42* (2013.01); *B32B 7/12* (2013.01); *B32B 27/08* (2013.01); *B32B 27/32* (2013.01); *B32B 27/34* (2013.01); *B32B 27/36* (2013.01); *B65D 65/40* (2013.01); *C23C 14/02* (2013.01); *C23C 14/081* (2013.01); *C23C 14/24* (2013.01); *B32B 2250/03* (2013.01); *B32B 2250/24* (2013.01); *B32B 2255/10* (2013.01); *B32B 2255/20* (2013.01); *B32B 2255/26* (2013.01); *B32B 2307/31* (2013.01); *B32B 2307/7244* (2013.01); *B32B 2307/7246* (2013.01); *B32B 2553/00* (2013.01)

(58) Field of Classification Search
CPC .......... B65D 65/42; B65D 65/40; B32B 7/12; B32B 27/08; B32B 27/32; B32B 27/34; B32B 2250/03; B32B 2255/10; B32B 2255/20; B32B 2255/26; B32B 2307/31; B32B 2307/7244; B32B 2307/7246; B32B 2553/00
See application file for complete search history.

(56) References Cited

U.S. PATENT DOCUMENTS

2013/0237663 A1*    9/2013    Tanaka ..................... C08K 5/56
                                                       524/588

FOREIGN PATENT DOCUMENTS

| JP | H07164591 A | 6/1995 |
|---|---|---|
| JP | H1158592 A | 3/1999 |
| JP | H11129384 A | 5/1999 |
| JP | 2002059519 A | 2/2002 |
| JP | 2005231039 A | 9/2005 |
| JP | 2008-290406 | 12/2008 |
| JP | 2012096469 A | 5/2012 |
| JP | 2015036208 A * | 2/2015 |
| WO | 2004048081 A1 | 6/2004 |
| WO | 2017/209107 | 12/2017 |

OTHER PUBLICATIONS

Machine Translation of JP 2015036208 A (Year: 2015).*
(Continued)

*Primary Examiner* — Callie E Shosho
*Assistant Examiner* — Bethany M Miller
(74) *Attorney, Agent, or Firm* — HSML P.C.

(57) ABSTRACT

Provided is a barrier film which is less likely to undergo deterioration of gas barrier properties even after the Gelbo Flex test. The barrier film according to the present invention includes a barrier coat layer, an inorganic oxide vapor deposition layer, and a substrate layer in this order, the barrier coat layer being a cured film of a barrier coat composition containing: a hydrolyzed product of an alkoxysilane represented by the following General Formula (I): $Si(OR^1)_4 \ldots$ (I), wherein $R^1$ represents an organic functional group; a water-soluble polymer; and a hydrolyzed product of a silane coupling agent represented by the following General Formula (II): $R^2{}_n Si(OR^3)_{4-n} \ldots$ (II), wherein $R^2$ and $R^3$ each independently represent an organic functional group, and n is 2 or 3.

12 Claims, 1 Drawing Sheet

(56) References Cited

OTHER PUBLICATIONS

International Search Report (in Japanese and English) and Written Opinion issued in PCT/JP2019/022271, dated Sep. 10, 2019, 9 pages provided.
International Preliminary Report on Patentability, issued in the corresponding PCT application No. PCT/JP2019/022271, dated Dec. 17, 2020, 7 pages.
Japanese Office Action, issued in the corresponding Japanese patent application No. 2018-109547, dated Oct. 12, 2021, 6 pages.

* cited by examiner

BARRIER FILM AND PACKAGING MATERIAL

TECHNICAL FIELD

The present invention relates to a barrier film, more specifically, a barrier film comprising a barrier coat layer, an inorganic oxide vapor deposition layer, and a substrate layer in this order. The present invention also relates to a packaging material comprising the barrier film.

BACKGROUND ART

Conventionally, packaging materials used for packaging of foods, daily necessaries, pharmaceuticals, and the like have been required to prevent effects of gases that deteriorate their contents, such as oxygen and water vapor that permeate through the packaging materials, for the purpose of suppressing deterioration of the contents, and maintaining their functions and properties. In view of this, those packaging materials have been required to have gas barrier properties for blocking these gases. Therefore, among polymers, films of vinylidene chloride-based resin, and films coated with those resins, having excellent gas barrier properties have often been used. However, those films have technical problems that their gas barrier properties are largely affected by the temperature, humidity, and the like, and hence that they do not meet the need of high gas barrier properties.

In view of this, in cases where high gas barrier properties are required, packaging materials using, for example, a metal foil composed of a metal such as aluminum as a gas barrier layer have been used. However, although packaging materials using a metal foil composed of a metal such as aluminum have high gas barrier properties that are not affected by the temperature and humidity, those packaging materials have technical problems including the fact that the contents cannot be seen through the packaging materials, the fact that the packaging materials need to be treated as incombustible materials when they are discarded after use, and the fact that metal detectors are not applicable for inspection.

In recent years, for solving these technical problems, vapor deposited films prepared by laminating, on a polymer film, a vapor deposition thin film layer of an inorganic oxide such as silicon oxide, aluminum oxide, or magnesium oxide by formation means such as vacuum deposition or sputtering are used as packaging materials. These vapor deposited films are said to be suitable as packaging materials having both transparency, which cannot be obtained with metal foils and the like, and gas barrier properties. However, even such gas-barrier-laminated films have a technical problem that sterilization treatment at high temperature leads to lowering of gas barrier properties.

Thus, in order to solve such technical problems, a gas-barrier-laminated film comprising a resin substrate, a gas barrier vapor deposition layer provided on the resin substrate, mainly containing an inorganic compound and a gas barrier covering layer provided on the gas barrier vapor deposition layer, which gas barrier covering layer is obtained by applying, and then drying, a coating liquid containing a particular silicon compound and a hydrolysate thereof and a water-soluble polymer containing a hydroxyl group; has been proposed (see Patent Document 1).

PRIOR ART DOCUMENT

Patent Document

Patent Document 1: WO 2004-048081

SUMMARY OF THE INVENTION

Problems to be Solved by the Invention

However, it was found that even the gas-barrier-laminated film proposed in Patent Document 1 has insufficient bending resistance, so that, when the film is used as a packaging material, its gas barrier properties are deteriorated after the Gelbo Flex test, indicating that the film has a technical problem.

The present invention was carried out in view of the background art and the new technical problems described above, and an object of the invention is to provide a barrier film which is less likely to undergo deterioration of gas barrier properties even after the Gelbo Flex test in cases of use as a packaging material. Another object of the invention is to provide a packaging material having excellent barrier properties and bending resistance using such a barrier film.

Means for Solving the Problems

In order to solve the above problems, the present inventors intensively studied to discover that the problems can be solved with a barrier film comprising a barrier coat layer, an inorganic oxide vapor deposition layer, and a substrate layer in this order, the barrier coat layer being formed with a barrier coat composition containing: a hydrolyzed product of an alkoxysilane having a particular structure; a hydrolyzed product of a silane coupling agent having a particular structure; and a water-soluble polymer. The present invention was completed based on such a discovery.

More specifically, according to one aspect of the present invention, a barrier film comprising a barrier coat layer, an inorganic oxide vapor deposition layer, and a substrate layer in this order,
   the barrier coat layer being a cured film of a barrier coat composition comprising:
   a hydrolyzed product of an alkoxysilane represented by the following General Formula (I):

$$\mathrm{Si(OR^1)_4} \tag{I}$$

wherein $R^1$ represents an organic functional group; a water-soluble polymer; and
   a hydrolyzed product of a silane coupling agent represented by the following General Formula (II):

$$\mathrm{R^2{}_n Si(OR^3)_{4-n}} \tag{II}$$

wherein $R^2$ and $R^3$ each independently represent an organic functional group, and n is 2 or 3; is provided.

In the above-described aspect of the present invention, the surface of the barrier coat layer preferably has a ratio of silicon atom to carbon atom (Si/C) of 1.0 to 2.5 as measured by X-ray photoelectron spectroscopy (XPS).

In the above-described aspect of the present invention, the inorganic oxide vapor deposition layer is preferably an aluminum oxide vapor deposition film or a silicon oxide vapor deposition film.

In the above-described aspect of the present invention, the organic functional groups of $R^2$ in the General Formula (I)

preferably each independently contain a hydrocarbon group, an epoxy group, a (meth)acryloxy group, a ureido group, or an isocyanate group.

In the above-described aspect of the present invention, the oxygen permeability of the barrier film is preferably not more than 1.0 cc/m$^2$·atm·day as measured according to JIS K7126 in an environment at a temperature of 23° C. and a humidity of 90% RH.

In the above-described aspect of the present invention, the water vapor permeability of the barrier film is preferably not more than 1.0 g/m$^2$·day as measured according to JIS K7129 in an environment at a temperature of 40° C. and a humidity of 100% RH.

According to another aspect of the present invention, a packaging material comprising the barrier film is provided.

In the other aspect of the present invention, the packaging material preferably comprises a heat seal layer, an intermediate layer, and a barrier layer comprising the barrier film in this order.

In the other aspect of the present invention, the heat seal layer preferably comprises a polyolefin-based resin.

In the other aspect of the present invention, the intermediate layer preferably comprises a polyamide-based resin.

Effect of the Invention

According to the present invention, a barrier film which is less likely to undergo deterioration of gas barrier properties even after the Gelbo Flex test in cases of use as a packaging material can be provided. Further, a packaging material having excellent barrier properties and bending resistance can be provided using such a barrier film.

MODE FOR CARRYING OUT THE INVENTION

<Barrier Film>

The barrier film according to the present invention comprises a barrier coat layer, an inorganic oxide vapor deposition layer, and a substrate layer in this order. By using a barrier film of the present invention having such a layer configuration as a packaging material, the packaging material can have improved bending resistance. Therefore, the gas barrier properties are less likely to be deteriorated even after the Gelbo Flex test. Such a barrier film can be suitably used as a barrier layer for a packaged product which requires gas barrier properties even after the Gelbo Flex test.

The oxygen permeability of the barrier film is preferably not more than 1.0 cc/m$^2$·atm·day, more preferably not more than 0.8 cc/m$^2$·atm·day, still more preferably not more than 0.6 cc/m$^2$·atm·day, still more preferably not more than 0.5 cc/m$^2$·atm·day, as measured according to JIS K7126 in an environment at a temperature of 23° C. and a humidity of 90% RH. In cases where the oxygen permeability of the barrier film satisfies the value range, the barrier film has favorable oxygen barrier properties. Therefore, when the barrier film is used as a barrier layer of a packaging material, adverse effects on the content of the packaging material can be suppressed.

The water vapor permeability of the barrier film is preferably not more than 1.0 g/m$^2$·day, more preferably not more than 0.9 g/m$^2$·day, still more preferably not more than 0.8 g/m$^2$·day, still more preferably not more than 0.7 g/m$^2$·day, as measured according to JIS K7129 in an environment at a temperature of 40° C. and a humidity of 100% RH. In cases where the water vapor permeability of the barrier film satisfies the value range, the barrier film has favorable water vapor barrier properties. Therefore, when the barrier film is used as a barrier layer of a packaging material, adverse effects on the content of the packaging material can be suppressed.

Figure 1:
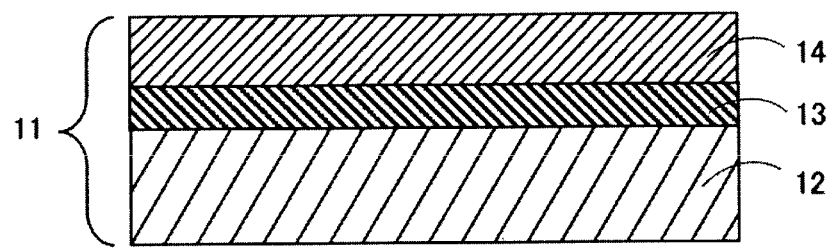
FIG. 1 is a schematic cross-sectional view illustrating one embodiment of the barrier film of the present invention.

The layer configuration of one embodiment of the barrier film of the present invention is described below with reference to a drawing. FIG. 1 illustrates a barrier film 11, comprising an inorganic oxide vapor deposition layer 13 on one side of a substrate layer 12, and a barrier coat layer 14 on the inorganic oxide vapor deposition layer 13. Each layer constituting the barrier film of the present invention is described below.

(Substrate Layer)

The substrate layer used in the barrier film of the present invention is not limited, and may be a film of a resin having excellent chemical or physical strength, which withstands, for example, conditions for forming a vapor deposition film of an inorganic oxide, and which does not deteriorate properties of the vapor deposition film, and hence enables good maintenance of those properties. Specific examples of the resin for the film include: polyolefin-based resin such as polyethylene-based resin and polypropylene-based resin; cyclic polyolefin-based resin; polystyrene resins; acrylonitrile-styrene copolymer (AS resin); acrylonitrile-butadiene-styrene copolymer (ABS resin); poly(meth)acrylic-based resin; polycarbonate-based resin; polyvinyl alcohol-based resin; saponified ethylene-vinyl ester copolymer; polyester-based resin such as polyethylene terephthalate and polyethylene naphthalate; polyamide-based resin such as nylons; polyurethane-based resin; acetal-based resin; and cellulose-based resin. In the present invention, among the films of the resins described above, it is particularly preferred to use a film of a polyester-based resin, polyolefin-based resin, or polyamide-based resin. As the substrate layer, any of unstretched films and uniaxially or biaxially stretched films of the resins described above may be used.

As the polyester-based resin film, the following polyester films may be used as well as common polyethylene terephthalate derived from a fossil fuel.

(Polybutylene Terephthalate Film (PBT))

The polybutylene terephthalate film has a high heat distortion temperature, excellent mechanical strength and electric properties, and good moldability. Therefore, its use for a packaging bag to be used for storing a content such as food enables suppression of deformation, and suppression of deterioration of the strength, of the packaging bag during retort processing. The polybutylene terephthalate film is a film containing polybutylene terephthalate (hereinafter also referred to as PBT) as a major component, preferably a resin film containing PBT at not less than 60% by weight.

(Biomass-Derived Polyester Film)

The biomass-derived polyester film is composed of a resin composition containing, as a major component, a polyester consisting of a diol unit and a dicarboxylic acid unit. In the resin composition, a polyester in which the diol unit is biomass-derived ethylene glycol, and in which the dicarboxylic acid unit is fossil-fuel-derived dicarboxylic acid unit, is contained at 50 to 95% by weight, preferably 50 to 90% by weight with respect to the whole resin composition.

The biomass-derived ethylene glycol is obtained using, as a raw material, ethanol (biomass ethanol) produced using a biomass such as sugar cane or maize as a raw material. For example, the biomass-derived ethylene glycol may be obtained by a conventionally known method for production of ethylene glycol from biomass ethanol through ethylene oxide. Alternatively, a commercially available biomass ethylene glycol may be used. For example, a biomass ethylene glycol commercially available from India Glycols Limited may be preferably used.

As the dicarboxylic acid unit of the polyester, fossil-fuel-derived dicarboxylic acid is used. Examples of the dicarboxylic acid include aromatic dicarboxylic acid, aliphatic dicarboxylic acid, and derivatives thereof. Examples of the aromatic dicarboxylic acid include terephthalic acid and isophthalic acid. Examples of the derivatives of aromatic dicarboxylic acid include lower alkyl esters, such as methyl ester, ethyl ester, propyl ester, and butyl ester, of aromatic dicarboxylic acid. Among these, terephthalic acid is preferred. As a derivative of aromatic dicarboxylic acid, dimethyl terephthalate is preferred.

The polyester that may be contained at a ratio of 5 to 45% by weight in the resin composition forming the biomass-derived polyester film is a fossil-fuel-derived polyester, a recycled polyester of a fossil-fuel-derived polyester product, or a recycled polyester of a biomass-derived polyester product.

(Recycled Polyethylene Terephthalate)

This is a polyethylene terephthalate film containing a polyethylene terephthalate recycled by mechanical recycling. Specific examples thereof include a PET recycled from PET bottles by mechanical recycling, in which the diol component is ethylene glycol, and in which the dicarboxylic acid component contains terephthalic acid and isophthalic acid. The content of the isophthalic acid component is preferably 0.5 mol % to 5 mol %, more preferably 1.0 mol % to 2.5 mol % in the total dicarboxylic acid components constituting the PET.

The mechanical recycling, in general, is a method in which a polyethylene terephthalate resin product such as a collected PET bottle is pulverized and alkali-washed to remove dirt and foreign materials on the surface of the PET resin product, followed by drying at high temperature under reduced pressure for a certain length of time to allow diffusion of contaminants remaining in the PET resin, to carry out decontamination, thereby removing dirt from the resin product composed of the PET resin, to recover the resin product into the PET resin.

The recycled polyethylene terephthalate preferably contains recycled PET at a ratio of 50% by weight to 95% by weight, and may contain virgin PET. The virgin PET commonly contains ethylene glycol as diol component and terephthalic acid as a dicarboxylic acid component. Further, the dicarboxylic acid component may contain isophthalic acid.

The resin films have a film thickness of preferably about 6 to 2000 μm, more preferably about 9 to 100 μm.

In the present invention, before the formation of the inorganic oxide vapor deposition film on the substrate layer, the substrate layer may be preliminarily subjected to surface treatment. By this, adhesion to the inorganic oxide vapor deposition film can be improved. Similarly, the vapor deposition layer may be subjected to surface treatment to improve adhesion to the gas barrier coating film. Examples of the surface treatment include pretreatments such as corona discharge treatment, ozone treatment, low-temperature plasma treatment using oxygen gas or nitrogen gas, glow discharge treatment, and oxidizing treatment by treatment using a chemical agent or the like.

The surface treatment may also be arbitrary application of a primer coating agent, undercoating agent, or vapor deposition anchor coating agent. Examples of the coating agent include resin compositions containing, as a major component of the vehicle, a polyester-based resin; polyamide-based resin; polyurethane-based resin; epoxy-based resin; phenol-based resin; (meth)acrylic-based resin; polyvinyl acetate-based resin; polyolefin-based resin such as polyethylene or polypropylene, or copolymer or modified resin thereof; cellulose-based resin; or the like.

Among such surface treatments, corona treatment or plasma treatment is especially preferably carried out. Examples of the plasma treatment include plasma treatment in which surface modification is carried out by using a plasma gas generated by ionization of a gas by arc discharge. Other examples of the plasma gas include inorganic gases such as oxygen gas, nitrogen gas, argon gas, and helium gas. For example, by in-line plasma treatment, moisture, dusts, and the like on the surface of the substrate layer can be removed, and surface treatments such as smoothing and activation of the surface become possible. Further, plasma treatment may be carried out after the vapor deposition, to improve the adhesion. In the present invention, in the plasma treatment, plasma discharge treatment is preferably carried out taking into account conditions such as the plasma output, the type of the plasma gas, the amount of the plasma gas supplied, and the treatment time. In the method for generating the plasma, an apparatus for direct-current glow discharge, high-frequency discharge, microwave discharge, or the like may be used. The plasma treatment may be carried out also by the atmospheric pressure plasma treatment method.

(Inorganic Oxide Vapor Deposition Layer)

The vapor deposition layer constituting the barrier film according to the present invention is a vapor deposition film of an inorganic oxide formed by a chemical vapor deposition method (CVD method) or physical vapor deposition method (PVD method).

The inorganic oxide is not limited, and vapor deposition films of an oxide of silicon, aluminum, magnesium, calcium, potassium, tin, sodium, boron, titanium, lead, zirconium, yttrium, or the like may be used. In particular, the inorganic oxide vapor deposition layer is preferably a vapor deposition film of aluminum oxide or silicon oxide, more preferably a vapor deposition film of aluminum oxide. The inorganic oxide is represented as $MO_X$ (wherein in the formula, M represents an inorganic element, and X represents a value whose range varies depending on the inorganic element), such as $AlO_X$ or $SiO_X$. In the present invention, from the viewpoint of transparency and gas barrier properties, when M is aluminum (Al), the value X is preferably 0.5 to 2.0; and when M is silicon (Si), the value X is preferably 1 to 2.

As the inorganic oxide vapor deposition layer, from the viewpoint of ease of handling as a vapor deposition material, an aluminum oxide vapor deposition film is preferably provided by a physical vapor deposition method. The aluminum oxide vapor deposition film formed by a physical vapor deposition method exhibits excellent adhesion to the surface of the gas barrier coating film. Examples of the physical vapor deposition method include physical vapor deposition methods (PVD methods) such as vacuum vapor deposition, sputtering, ion plating, and ion cluster beam.

More specifically, the vapor deposition film may be formed using a vacuum vapor deposition method in which aluminum or an oxide thereof as a raw material is heated to allow its vaporization followed by deposition of the resulting vapor on one side of the substrate layer, for example, an oxidation reaction vapor deposition method in which aluminum or an oxide thereof as a raw material is oxidized by introduction of oxygen, followed by vapor deposition on one side of the substrate layer, or a plasma-assisted oxidation reaction vapor deposition method in which the oxidation reaction is further assisted with plasma. Examples of the heating method for the vapor deposition material include the resistance heating method, high-frequency induction heating method, and electron beam heating method (EB).

In cases where the inorganic oxide vapor deposition layer is a silicon oxide vapor deposition film, from the viewpoint of bending resistance and gas barrier properties, the silicon oxide vapor deposition film is preferably provided by a chemical vapor deposition method. Examples of the chemical vapor deposition method include chemical vapor deposition methods (CVD methods) such as the plasma chemical vapor deposition method, low-temperature plasma chemical vapor deposition method, thermochemical vapor deposition method, and photochemical vapor deposition method. More specifically, a silicon oxide vapor deposition film may be formed on one side of the substrate layer by a low-temperature plasma chemical vapor deposition method using a low-temperature plasma generator or the like, wherein a monomer gas for vapor deposition of an organic silicon compound or the like is used as a raw material; an inert gas such as argon gas or helium gas is used as a carrier gas; and oxygen gas or the like is used as an oxygen-supplying gas. Examples of the low-temperature plasma generator include generators of high-frequency plasma, pulsed plasma, microwave plasma, or the like. From the viewpoint of obtaining highly active and stable plasma, a generator based on the high-frequency plasma method is preferably used.

Examples of the monomer gas for vapor deposition of the organic silicon compound for forming the silicon oxide vapor deposition film include 1,1,3,3-tetramethyldisiloxane, hexamethyldisiloxane, vinyltrimethylsilane, methyltrimethylsilane, hexamethyldisilane, methylsilane, dimethylsilane, trimethylsilane, diethylsilane, propylsilane, phenylsilane, vinyltriethoxysilane, vinyltrimethoxysilane, tetramethoxysilane, tetraethoxysilane, phenyltrimethoxysilane, methyltriethoxysilane, and octamethylcyclotetrasiloxane. Among these, 1,1,3,3-tetramethyldisiloxane or hexamethyldisiloxane is especially preferably used as the raw material, from the viewpoint of ease of handling, properties of the continuous film formed, and the like. As the inert gas described above, argon gas, helium gas, or the like may be used.

The silicon oxide vapor deposition film mainly contains silicon oxide, and may also contain at least one compound composed of one or more of carbon, hydrogen, nitrogen, silicon, and oxygen elements through chemical bonding or the like. For example, the silicon oxide vapor deposition film may contain a compound containing a C—H bond, a compound containing an Si—H bond, or, when the carbon unit is in a graphite form, diamond form, fullerene form, or the like, a raw material organic silicon compound or a derivative thereof, through chemical bonding or the like. Examples thereof include hydrocarbons containing a $CH_3$ site; hydrosilica such as $SiH_3$ silyl and $SiH_2$ silylene; and hydroxyl group derivatives such as $SiH_2OH$ silanol. In addition, by changing conditions of the vapor deposition process and/or the like, the types and the amounts of compounds contained in the silicon oxide vapor deposition film can be changed.

The inorganic oxide vapor deposition layer has a film thickness of 3 to 100 nm, preferably 5 to 50 nm, more preferably 8 to 30 nm. In cases where the inorganic oxide vapor deposition layer has a film thickness within this range, its gas barrier properties are less likely to be deteriorated even after a wet-heat sterilization process (retort processing).

(Barrier Coat Layer)

The barrier coat layer constituting the barrier film according to the present invention is a layer having gas barrier properties, and is a cured film of a barrier coat composition comprising: a hydrolyzed product of a particular tetraalkoxysilane described below in detail; a water-soluble polymer; and a hydrolyzed product of a particular silane coupling agent (monoalkoxysilane or dialkoxysilane) described below in detail. The barrier coat layer is a cured film prepared by, for example, polycondensation of a barrier coat composition by the sol-gel method in the presence of a sol-gel-method catalyst, an acid, water, and an organic solvent. The barrier coat layer of the present invention, which is a cured film prepared by reaction of the particular silane coupling agent (monoalkoxysilane or dialkoxysilane), the particular tetraalkoxysilane, and the water-soluble polymer, has a lower cross-linking density than the cross-linking density of a cured film prepared with a system using trialkoxysilane as a silane coupling agent. Thus, the overcoat layer in the present invention is formed as a cured film having both excellent gas barrier properties and flexibility, and as a result, the gas barrier film of the present invention also has excellent bending resistance. Therefore, the gas barrier properties of a packaging material using the barrier film are less likely to be deteriorated even after the Gelbo Flex test.

The alkoxysilane used in the present invention is represented by the following General Formula (I):

$$Si(OR^1)_4 \qquad (I)$$

wherein in the formula, $R^1$ represents an organic functional group.

In the General Formula (I), $R^1$ is, for example, a $C_1$-$C_8$ organic functional group, preferably a $C_1$-$C_8$ alkyl group or $C_3$-$C_7$ alkoxyalkyl group which may be branched. Examples of the $C_1$-$C_8$ alkyl group include methyl, ethyl, n-propyl, i-propyl, n-butyl, and sec-butyl.

Examples of the $C_3$-$C_7$ alkoxyalkyl group include groups formed by removing one hydrogen atom from a linear or branched ether such as methyl ethyl ether, diethyl ether, methyl propyl ether, methyl isopropyl ether, ethyl propyl ether, ethyl isopropyl ether, methyl butyl ether, ethyl butyl ether, methyl sec-butyl ether, ethyl sec-butyl ether, methyl tert-butyl ether, or ethyl tert-butyl ether. The $(OR^1)$'s may be the same or different.

As the alkoxysilane represented by General Formula (I), at least one of partial hydrolysates of alkoxysilane and hydrolysis condensates of alkoxysilane may be used. The partial hydrolysates of alkoxysilane are not limited to those that have undergone hydrolysis of all alkoxy groups, and also include those that have undergone hydrolysis of one or more alkoxy groups, and mixtures thereof. The hydrolysis condensates include dimers and higher polymers of partially hydrolyzed alkoxides, more specifically, dimers to hexamers thereof.

Examples of the alkoxysilane represented by General Formula (I) include tetramethoxysilane $Si(OCH_3)_4$, tetraethoxysilane $Si(OC_2H_5)_4$, tetrapropoxysilane $Si(OC_3H_7)_4$, and tetrabutoxysilane $Si(OC_4H_9)_4$. In the present invention, polycondensates of these alkoxysilane may also be used. Specific examples of the polycondensates include polytetramethoxysilane and polytetraethoxysilane.

As the water-soluble polymer used in the present invention, a polyvinyl alcohol-based resin or an ethylene-vinyl alcohol copolymer may be used individually, or a polyvinyl alcohol-based resin and an ethylene-vinyl alcohol copolymer may be used in combination. In the present invention, by the use of a polyvinyl alcohol-based resin and/or an ethylene-vinyl alcohol copolymer, remarkable improvement can be achieved for gas barrier properties, water resistance, weather resistance, and other physical properties.

As the polyvinyl alcohol-based resin, a resin obtained by saponifying polyvinyl acetate may be generally used. The polyvinyl alcohol-based resin is not limited, and may be a partially saponified polyvinyl alcohol-based resin in which several ten percent of acetate groups are remaining, a completely saponified polyvinyl alcohol in which no acetate group is remaining, or a modified polyvinyl alcohol-based resin prepared by OH-group modification.

As the ethylene-vinyl alcohol copolymer, a saponified product of a copolymer of ethylene and vinyl acetate, that is, a product obtained by saponifying an ethylene-vinyl acetate random copolymer may be used. Examples of the product include, but are not limited to, partially saponified products in which several ten percent by mole of acetate groups are remaining, and completely saponified products in which only several percent by mole of acetate groups are remaining, or no acetate group is remaining. However, from the viewpoint of gas barrier properties, the degree of saponification is preferably not less than 80 mol %, more preferably not less than 90 mol %, still more preferably not less than 95 mol %. The content of repeat units derived from ethylene (hereinafter also referred to as "ethylene content") in the ethylene-vinyl alcohol copolymer is usually 0 to 50 mol %, preferably 20 to 45 mol %.

The silane coupling agent used in the present invention is represented by the following General Formula (II):

$$R^2{}_n Si(OR^3)_{4-n} \quad (II)$$

wherein $R^2$ and $R^3$ each independently represent an organic functional group, and n is 2 or 3.

By using such a silane coupling agent, elasticity can be given to the cured film of the gas barrier composition, so that a barrier film having excellent bending resistance can be obtained.

Examples of $R^2$ in the General Formula (II) include functional groups containing: a hydrocarbon group such as an alkyl group or alkylene group; an epoxy group; a (meth) acryloxy group; a ureido group; a vinyl group; an amino group; an isocyanurate group; or an isocyanate group. More specifically, at least one of the two or three $R^2$'s is preferably a functional group containing an epoxy group. A 3-glycidoxypropyl group and a 2-(3,4 epoxycyclohexyl) group are more preferred. The $R^2$'s may be the same or different.

In the General Formula (II), $R^3$ is, for example, a $C_1$-$C_8$ organic functional group, preferably a $C_1$-$C_8$ alkyl group or $C_3$-$C_7$ alkoxyalkyl group which may be branched. Examples of the $C_1$-$C_8$ alkyl group include methyl, ethyl, n-propyl, i-propyl, n-butyl, and sec-butyl. Examples of the $C_3$-$C_7$ alkoxyalkyl group include groups formed by removing one hydrogen atom from a linear or branched ether such as methyl ethyl ether, diethyl ether, methyl propyl ether, methyl isopropyl ether, ethyl propyl ether, ethyl isopropyl ether, methyl butyl ether, ethyl butyl ether, methyl sec-butyl ether, ethyl sec-butyl ether, methyl tert-butyl ether, or ethyl tert-butyl ether. The $(OR^3)$'s may be the same or different.

Examples of the silane coupling agent represented by the General Formula (II) include 3-glycidoxypropylmethyldimethoxysilane and 3-glycidoxypropylmethydiethoxysilane in the case where n=2; and 3-glycidoxypropyldimethylmethoxysilane, 3-glycidoxypropyldimethylethoxysilane, 2-(3,4-epoxycyclohexyl)dimethylmethoxysilane, and 2-(3, 4-epoxylcyclohexyl)dimethylethoxysilane in the case where n=3.

In the present invention, for enhancing barrier properties of the barrier film, a trialkoxysilane represented by $R^4 Si(OR^5)_3$ may be further added to the barrier coat composition. $R^4$ and $R^5$ may be the same organic functional groups as the above-described $R^2$ and $R^3$, respectively, and examples thereof include 3-glycidoxypropyltrimethoxysilane and 3-glycidoxypropyltriethoxysilane.

The amount of the trialkoxysilane added is preferably not more than 50% in terms of $R^4 Si(OR^5)_3 / (R^2{}_n Si(OR^3)_{4-n} + R^4 Si(OR^5)_3)$ (weight ratio). In cases where the amount of the trialkoxysilane added is within this value range, the barrier properties can be enhanced without significantly adversely affecting the bending property of the barrier film.

Examples of organic solvent used for the barrier coat composition include methyl alcohol, ethyl alcohol, n-propyl alcohol, isopropyl alcohol, and n-butanol. The polyvinyl alcohol-based resin and/or the ethylene-vinyl alcohol copolymer is/are preferably handled in a state where it is/they are dissolved in a coating liquid containing the alkoxide, silane coupling agent, and the like, using an organic solvent appropriately selected from those described above. In cases where the polyvinyl alcohol-based resin and the ethylene-vinyl alcohol copolymer are used in combination, n-butanol is preferably used.

In the barrier coat composition in the present invention, a ratio of silicon atom to carbon atom (Si/C) as measured by X-ray photoelectron spectroscopy (XPS) is adjusted within the range of preferably 1.0 to 2.5, more preferably 1.1 to 2.2, still more preferably 1.2 to 1.9, to achieve excellent barrier properties. In cases where Si/C is less than 1.0, water vapor barrier properties may be deteriorated, while in cases where Si/C is more than 2.5, the barrier coat layer may be easily broken. Thus, Si/C is preferably within the range described above.

The barrier coat layer may be produced by the following method. First, the alkoxysilane, water-soluble polymer, silane coupling agent, sol-gel-method catalyst, acid, water, organic solvent, and/or the like are mixed together to prepare a barrier coat composition (barrier coat liquid).

Subsequently, the barrier coat composition is applied onto the inorganic oxide vapor deposition layer. Regarding the method of applying the barrier coat composition, the coating film can be formed by one or more times of application of the composition by application means such as roll coating with a gravure roll coater; spray coating; spin coating; dipping; brushing; bar coating; or applicator coating.

Subsequently, the film to which the barrier coat composition is applied is heated and dried at a temperature of not more than the melting point of the resin film of the substrate layer of the barrier film within the range of 20° C. to 200° C., preferably at a temperature within the range of 50° C. to 180° C., for 10 seconds to 10 minutes. By this, polycondensation occurs to allow formation of the barrier coat layer. Alternatively, the barrier coat composition may be repeatedly applied onto the inorganic oxide vapor deposition layer to form two or more coating film layers, and may then be heated and dried at a temperature of not more than the melting point of the resin substrate within the range of 20° C. to 200° C. for 10 seconds to 10 minutes, to allow formation of a composite polymer layer in which two or more barrier coat layers are formed. By this, one or more barrier coat layers can be formed with the barrier coat composition.

The barrier coat layer has a thickness of preferably 10 to 5000 nm, more preferably 50 to 1000 nm, still more preferably 100 to 500 nm. In cases where the thickness of the barrier coat layer is within or close to the range described above, the gas barrier properties can be produced, and the barrier coat layer can be provided as a flexible layer with which the surface of the inorganic oxide vapor deposition layer can be coated.

<Packaging Material>

The packaging material according to the present invention at least comprises a heat seal layer, an intermediate layer, and a barrier layer which is composed of the barrier film of the present invention in this order. Since the packaging material of the present invention uses the barrier film of the present invention, it has excellent bending resistance, and its gas barrier properties are less likely to be deteriorated even after the Gelbo Flex test. Therefore, the packaging material of the present invention can be suitably used as a packaging material for a packaged product which requires bending resistance.

The oxygen permeability of the packaging material is preferably not more than 4.0 cc/m²·atm·day, more preferably not more than 3.5 cc/m²·atm·day, still more preferably not more than 3.0 cc/m²·atm·day, still more preferably not more than 2.9 cc/m²·atm·day, as measured according to JIS K7126 in an environment at a temperature of 23° C. and a humidity of 90% RH after the Gelbo Flex test according to ASTM F392. In cases where the oxygen permeability of the packaging material after the Gelbo Flex test satisfies the value range, the packaging material has favorable oxygen barrier properties. Therefore, even when the packaged product requires bending resistance, adverse effects on the content of the packaging material can be suppressed.

The water vapor permeability of the packaging material is preferably not more than 2.2 g/m²·day, more preferably not more than 2.0 g/m²·day, still more preferably not more than 1.8 g/m²·day, as measured according to JIS K7129 in an environment at a temperature of 40° C. and a humidity of 100% RH after the Gelbo Flex test according to ASTM F392. In cases where the water vapor permeability of the packaging material after the Gelbo Flex test satisfies the value range, the packaging material has favorable water vapor barrier properties. Therefore, even when the packaged product requires bending resistance, adverse effects on the content of the packaging material can be suppressed.

Figure 2:
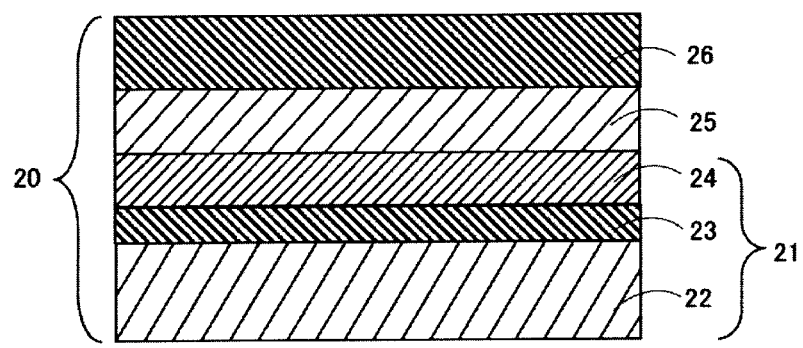
FIG. 2 is a schematic cross-sectional view illustrating one embodiment of the packaging material of the present invention.

The layer configuration of one embodiment of the packaging material of the present invention is described below with reference to a drawing. The packaging material 20 illustrated in FIG. 2 comprises a barrier layer 21 (barrier film) comprising, from the outermost-layer side, a substrate layer 22 (outermost layer), an inorganic oxide vapor deposition layer 23, and a barrier coat layer 24 (barrier film) in this order, and comprises an intermediate layer 25 and a heat seal layer 26 (innermost layer) in this order in the side of the barrier coat layer 24 (inner side) of the barrier layer 21. Additionally, an adhesive layer(s) (not shown) may be present between the barrier coat layer 24 and the intermediate layer 25, and/or between the intermediate layer 25 and the heat seal layer 26. Each layer constituting the packaging material of the present invention is described below. Here, description of the barrier layer in the packaging material is omitted since it is the barrier film already described in detail.

(Intermediate Layer)

In the packaging material of the present invention, various resin layers and resin films may be used as the intermediate layer for giving durability, bending resistance, and the like to the packaging material. For example, as the intermediate layer, a polyester-based resin, polyolefin-based resin, or polyamide-based resin may be used. A polyamide-based resin is preferably used. Examples of the polyamide-based resin include nylons such as polycaproamide (nylon 6), poly-ω-aminoheptanoic acid (nylon 7), poly-9-aminononanoic acid (nylon 9), polyundecanamide (nylon 11), polylauryllactam (nylon 12), polyethylenediamine adipamide (nylon 2,6), polytetramethylene adipamide (nylon 4,6), polyhexamethylene diadipamide (nylon 6,6), polyhexamethylene sebacamide (nylon 6,10), polyhexamethylene dodecamide (nylon 6,12), polyoctamethylene adipamide (nylon 8,6), polydecamethylene adipamide (nylon 10,6), polydecamethylene sebacamide (nylon 10,10), polydodecamethylene dodecamide (nylon 12,12), and metaxylenediamine-6 nylon (MXD6). Nylon 6-6,6, which is a copolymer of nylon 6 and nylon 6,6; nylon 6-12, which is a copolymer of nylon 6 and nylon 12; or the like may also be used. By using these nylons, bending resistance can be given to the packaging material. The method of forming the intermediate layer is not limited, and the intermediate layer may be formed by a conventionally known method. For example, the intermediate layer may be formed by extrusion molding of a resin, or a resin film may be used.

The thickness of the intermediate layer is not limited, and is preferably about 5 μm to 100 μm, more preferably about 10 μm to 50 μm.

(Heat Seal Layer)

In the packaging material of the present invention, a thermoplastic resin may be used as the heat seal layer. Specific examples of the thermoplastic resin include low-density polyethylene; medium-density polyethylene; high-density polyethylene; straight-chain (linear) low-density polyethylene; ethylene-α-olefin copolymers polymerized using a metallocene catalyst; polypropylene; ethylene-vinyl acetate copolymers; ionomer resins; ethylene-acrylic acid copolymers; ethylene-ethyl acrylate copolymers; ethylene-methacrylic acid copolymers; ethylene-methyl methacrylate copolymers; ethylene-propylene copolymers; methylpentene polymers; polybutene polymers; polyolefin-based resins such as polyethylene and polypropylene; acid-modified polyolefin resins prepared by modification of these polyolefin-based resins with an unsaturated carboxylic acid such as acrylic acid, methacrylic acid, maleic acid, maleic anhydride, fumaric acid, or itaconic acid; polyvinyl acetate-based resin; poly(meth)acrylic-based resin; and polyvinyl chloride-based resin.

One or more of the above thermoplastic resins may be melt-extruded using an extruder or the like onto the intermediate layer through, if desired, an anchor coat layer or the like, to form the heat seal layer. Alternatively, using one or more of the above thermoplastic resins, a film or sheet of the resin(s) may be preliminarily produced, and the film or sheet produced may be layered on the intermediate layer by dry lamination through a laminating-adhesive-agent layer or the like, to form the heat seal layer.

For obtaining desired properties, the resin may be blended with another resin. Additionally, various additives such as an antioxidant, UV absorber, antistatic agent, antiblocking agent, lubricant (fatty acid amide or the like), flame retardant, inorganic or organic filler, dye, pigment, and/or the like may be arbitrarily added thereto.

The thickness of the heat seal layer is not limited, and is preferably about 10 μm to 300 μm, more preferably about 20 μm to 100 μm, from the viewpoint of preventing poor sealing.

(Adhesive Layer)

In the packaging material of the present invention, the packaging material may further comprise an adhesive layer(s) between the barrier layer and the intermediate layer, and/or between the intermediate layer and the heat seal layer. Examples of the adhesive layer include adhesive-resin layers and adhesive-agent layers. In cases where the packaging material comprises an adhesive layer(s), the lamination strength of the interface(s) between the layers can be improved.

Examples of thermoplastic resins that may be used for the adhesive-resin layers include polyethylene-based resin, polypropylene-based resin, and cyclic polyolefin-based resin; and copolymer resins, modified resins, and mixtures (including alloys) containing these resins as a major component. Examples of the polyolefin-based resin include low-density polyethylene (LDPE); medium-density polyethylene (MDPE); high-density polyethylene (HDPE); straight-chain (linear) low-density polyethylene (LLDPE); polypropylene (PP); ethylene-α-olefin copolymers polymerized using a metallocene catalyst; ethylene-polypropylene random or block copolymers; ethylene-vinyl acetate copolymers (EVA); ethylene-acrylic acid copolymers (EAA); ethylene-ethyl acrylate copolymers (EEA); ethylene-methacrylic acid copolymers (EMAA); ethylene-methyl methacrylate copolymers (EMMA); ethylene-maleic acid copolymers; ionomer resins; and acid-modified polyolefin-based resin prepared by modification of the above polyolefin-based resin with an unsaturated carboxylic acid such as acrylic acid, methacrylic acid, maleic acid, maleic anhydride, fumaric acid, or itaconic acid for improving adhesion between layers. Further, for example, resins prepared by subjecting a polyolefin resin to graft polymerization or copolymerization with an unsaturated carboxylic acid, unsaturated carboxylic acid anhydride, or ester monomers may also be used. These materials may be used individually, or as a combination of two or more thereof. Examples of the cyclic polyolefin-based resin include ethylene-propylene copolymers, polymethylpentene, polybutene, and cyclic polyolefins such as polynorbornene. These resins may be used individually, or as a combination of two or more thereof.

Examples of the adhesive agent include one-liquid-type or two-liquid-type, curable or non-curable adhesives including vinyl-based adhesive, (meth)acrylic-based adhesive, polyamide-based adhesive, polyester-based adhesive, polyether-based adhesive, polyurethane-based adhesive, epoxy-based adhesive, rubber-based adhesive, and other adhesives, each of which may be, for example, in a solvent form, an aqueous form, or an emulsion form. Regarding the coating method for the laminating adhesive agent, the agent may be applied to an application surface(s) of a layer(s) constituting the barrier laminate by a method such as direct gravure roll coating, gravure roll coating, kiss coating, reverse roll coating, fountain coating, or transfer roll coating. The amount of the adhesive agent applied is preferably 0.1 g/m$^2$ to 10 g/m$^2$ (in a dry state), more preferably 1 g/m$^2$ to 5 g/m$^2$ (in a dry state).

EXAMPLES

The present invention is described below more concretely by way of Examples. However, the present invention is not limited to the following Examples.

<Production of Barrier Films and Packaging Materials>

Example 1

As a substrate layer, a biaxially stretched polyethylene terephthalate film (hereinafter referred to as PET film) having a thickness of 12 μm was provided. Plasma pretreatment was carried out for the surface of the PET film on which the inorganic oxide vapor deposition layer was to be formed, and, on the plasma-treated surface, an aluminum oxide vapor deposition film (inorganic oxide vapor deposition layer) having a thickness of 12 nm was continuously formed under the following condition using the reactive resistance heating method as the heating means of the vacuum vapor deposition method.

(Aluminum Oxide Film Formation Condition)

Degree of vacuum: $8.1 \times 10^{-2}$ Pa

According to a composition presented in Table 1, a preliminarily prepared hydrolysate of Composition B was added to a prepared mixture of Composition A, and the resulting mixture was stirred to obtain a colorless transparent barrier coat composition.

Subsequently, the aluminum oxide vapor deposition film of the PET film was coated with the barrier coat composition prepared as described above, by the direct gravure method. Thereafter, heat treatment was carried out at 180° C. for 60 seconds to form a barrier coat layer having a thickness of 300 nm (in a dry state), to obtain a barrier film.

Subsequently, on the barrier coat layer of the barrier film obtained as described above, a nylon film (thickness, 15 μm) was layered through an adhesive agent. Further, on the nylon film, a cast polypropylene film (CPP; thickness, 70 μm) was layered through an adhesive agent, to obtain a packaging material (layer configuration: substrate layer/aluminum oxide vapor deposition film/barrier coat layer/nylon film (intermediate layer)/CPP film (sealant layer)).

Example 2

A barrier film was obtained in the same manner as in Example 1 except that a different composition presented in Table 1 was used as the barrier coat composition.

Subsequently, a packaging material was obtained in the same manner as in Example 1 using the barrier film obtained as described above.

Comparative Example 1

A barrier film was obtained in the same manner as in Example 1 except that a different composition presented in Table 1 was used as the barrier coat composition.

Subsequently, a packaging material was obtained in the same manner as in Example 1 using the barrier film obtained as described above.

Example 3

A barrier film was obtained in the same manner as in Example 1 except that a different composition presented in Table 1 was used as the barrier coat composition.

Subsequently, a packaging material was obtained in the same manner as in Example 1 using the barrier film obtained as described above.

Example 4

A barrier film was obtained in the same manner as in Example 1 except that a different composition presented in Table 1 was used as the barrier coat composition.

Subsequently, a packaging material was obtained in the same manner as in Example 1 using the barrier film obtained as described above.

Comparative Example 2

A barrier film was obtained in the same manner as in Example 1 except that a different composition presented in Table 1 was used as the barrier coat composition.

Subsequently, a packaging material was obtained in the same manner as in Example 1 using the barrier film obtained as described above.

TABLE 1

| | Material | Example 1 | Example 2 | Comparative Example 1 | Example 3 | Example 4 | Comparative Example 2 |
|---|---|---|---|---|---|---|---|
| Composition A | Polyvinyl alcohol | 23.24 | 23.24 | 23.24 | 14.29 | 14.29 | 14.29 |
| | Isopropyl alcohol | 26.89 | 26.89 | 26.89 | 16.53 | 16.53 | 16.53 |
| | Water | 510.96 | 510.96 | 510.96 | 314.14 | 314.14 | 314.14 |
| Composition B | Tetraethoxysilane | 230.92 | 230.92 | 230.92 | 258.02 | 258.02 | 258.02 |
| | 3-Glycidoxypropyl-trimethoxysilane | — | 6.07 | 12.14 | — | 6.78 | 13.56 |
| | 3-Glycidoxypropyl-methyldimethoxysilane | 12.14 | 6.07 | — | 13.56 | 6.78 | — |
| | Isopropyl alcohol | 433.01 | 433.01 | 433.01 | — | — | — |
| | Methanol | — | — | — | 696.63 | 696.63 | 696.63 |
| | 0.5N Aqueous hydrochloric acid solution | 17.59 | 17.59 | 17.59 | 15.83 | 15.83 | 15.83 |
| | Water | 745.24 | 745.24 | 745.24 | 670.97 | 670.97 | 670.97 |

<Evaluation of Performances of Barrier Films>

The barrier films produced in the above Examples and Comparative Examples were subjected to the following measurement.

(Elementary Analysis of Barrier Coat Layer Surface)

The barrier film produced in each of the above Examples and Comparative Examples was subjected to X-ray photoelectron spectroscopy (XPS) to perform narrow scan analysis under the following measurement conditions, to measure the ratio between the Si element and the C element present on the surface of the barrier coat layer. The measurement results are shown in Table 2.

[Measurement Conditions]
Apparatus used: "ESCA-3400" (manufactured by Kratos)
 [1] Conditions for obtaining the spectrum
  Incident X-ray: MgKα (monochromatized X-ray, hv=1253.6 eV)
  X-Ray output: 150 W (10 kV, 15 mA)
  X-Ray scanning area (measured area): about 6 mm (diameter)
  Photoelectron acceptance angle: 90°
 [2] Ion spattering conditions
  Ion species: Ar$^+$
  Acceleration voltage: 0.2 (kV)
  Emission current: 20 (mA)
  Etching area: 10 mm (diameter)
  Ion spattering time: 30 seconds+30 seconds+60 seconds (total, 120 s); for obtaining the spectrum.

(Measurement of Oxygen Permeability)

The barrier film produced in each of the above Examples and Comparative Examples was subjected to measurement of the oxygen permeability (cc/m$^2$·atm·day) according to JIS K7126 under measurement conditions in an atmosphere at 23° C. at 90% RH using an oxygen permeability measurement apparatus (manufactured by Modern Control (MOCON) Inc. [model name, OX-TRAN 2/21]) such that the oxygen feed side was set to the substrate layer side of the barrier film. The measurement results are shown in Table 2.

(Measurement of Water Vapor Permeability)

The barrier film produced in each of the above Examples and Comparative Examples was subjected to measurement of the water vapor permeability (g/m$^2$·day) according to JIS K7129 under measurement conditions in an atmosphere at 40° C. at 100% RH using a water vapor permeability measurement apparatus (measurement apparatus manufactured by MOCON Inc. [model name, PERMATRAN 3/33]) such that the sensor side was set to the substrate layer side of the barrier film. The measurement results are shown in Table 2.

<Evaluation of Performances of Packaging Materials>

The packaging material produced in each of the above Examples and Comparative Examples was formed into a cylindrical shape, and subjected to five times of the Gelbo Flex test according to ASTM F392. Thereafter, part of the packaging material was cut out to obtain a test sample, which was subjected to the following measurement. Each of the following measurement results represents the average for three samples.

(Measurement of Oxygen Permeability)

The test sample was subjected to measurement of the oxygen permeability (cc/m$^2$·atm·day) according to JIS K7126 under measurement conditions in an atmosphere at 23° C. at 90% RH using an oxygen permeability measurement apparatus (manufactured by Modern Control (MOCON) Inc. [model name, OX-TRAN 2/21]) such that the oxygen feed side was set to the sealant layer (CPP film) side of the test sample. The measurement results are shown in Table 2.

(Measurement of Water Vapor Permeability)

The above test sample was subjected to measurement of the water vapor permeability (g/m$^2$·day) according to JIS K7129 under measurement conditions in an atmosphere at 40° C. at 100% RH using a water vapor permeability measurement apparatus (measurement apparatus manufactured by MOCON Inc. [model name, PERMATRAN 3/33]) such that the sensor side was set to the sealant layer (CPP film) side of the test sample. The measurement results are shown in Table 2.

(Evaluation Results)

Example 1, in which 3-glycidoxypropylmethyldimethoxysilane is contained at 100% by weight as the silane coupling agent, clearly showed less deterioration of barrier properties after the Gelbo Flex test, indicating better bending resistance compared to Comparative Example 1, which has the same Si (silicon)/C (carbon) ratio, but in which 3-gycidoxypropyltrimethoxysiane is contained at 100% by weight as the silane coupling agent. A similar evaluation result was obtained also between Example 3 and Comparative Example 2, wherein the Si (silicon)/C (carbon) ratio is the same.

Example 2 and Example 4, in which 3-glycidoxypropylmethyldimethoxysilane is contained at 50% by weight, also clearly showed less deterioration of barrier properties after the Gelbo Flex test, indicating better bending resistance compared to Comparative Examples 1 and 2, respectively.

TABLE 2

|  | Barrier film | | Packaging material (after Gelbo Flex test) | |
| --- | --- | --- | --- | --- |
| XPS Si/C | Oxygen permeability (cc/m$^2$ · atm · day) | Water vapor permeability (g/m$^2$ · day) | Oxygen permeability (cc/m$^2$ · atm · day) | Water vapor permeability (g/m$^2$ · day) |
| Example 1 | 1.3 | 0.3 | 0.5 | 2.6 | 1.6 |
| Example 2 | 1.3 | 0.2 | 0.4 | 2.9 | 1.7 |
| Comparative Example 1 | 1.3 | 0.1 | 0.3 | 3.1 | 2.0 |
| Example 3 | 1.8 | 0.4 | 0.7 | 3.4 | 1.9 |
| Example 4 | 1.8 | 0.3 | 0.6 | 3.6 | 2.1 |
| Comparative Example 2 | 1.8 | 0.2 | 0.5 | 4.0 | 2.6 |

DESCRIPTION OF SYMBOLS

11 Barrier film
12, 22 Substrate layer
13, 23 Inorganic oxide vapor deposition layer
14, 24 Barrier coat layer
20 Packaging material
21 Barrier layer (barrier film)
25 Intermediate layer
26 Heat seal layer

The invention claimed is:

1. A barrier film comprising a barrier coat layer, an inorganic oxide vapor deposition layer, and a substrate layer in this order,
the barrier coat layer being a cured film of a barrier coat composition comprising:
a hydrolyzed product of a tetraethoxysilane;
a polyvinyl alcohol; and
a hydrolyzed product of a silane coupling agent;
that is selected from the group consisting of 3-glycidoxypropylmethyldimethoxysilane and 3-glycidoxypropyltrimethoxysilane,
wherein the surface of the barrier coat layer has a ratio of silicon atom to carbon atom (Si/C) of 1.3 to 1.8 as measured by X-ray photoelectron spectroscopy (XPS), and
wherein the 3-glycidoxypropylmethyldimethoxysilane is required to be present in the silane coupling agent in an amount of at least 50% (weight ratio) and the amount of the 3-glycidoxypropyltrimethoxysilane in the silane coupling agent is not more than 50% (weight ratio).

2. The barrier film according to claim 1, wherein the inorganic oxide vapor deposition layer is an aluminum oxide vapor deposition film or a silicon oxide vapor deposition film.

3. The barrier film according to claim 1, wherein the oxygen permeability is not more than 1.0 cc/m$^2$·atm day as measured according to JIS K7126 in an environment at a temperature of 23° C. and a humidity of 90% RH.

4. The barrier film according to claim 1, wherein the water vapor permeability is not more than 1.0 g/m$^2$·day as measured according to JIS K7129 in an environment at a temperature of 40° C. and a humidity of 100% RH.

5. A packaging material comprising the barrier film according to claim 1.

6. The packaging material according to claim 5, comprising a heat seal layer, an intermediate layer, and a barrier layer comprising the barrier film in this order.

7. The packaging material according to claim 6, wherein the heat seal layer comprises a polyolefin-based resin.

8. The packaging material according to claim 6, wherein the intermediate layer comprises a polyamide-based resin.

9. The packaging material according to claim 1, wherein the silane coupling agent consists of 3-glycidoxypropylmethyldimethoxysilane.

10. The packaging material according to claim 1, wherein the inorganic oxide vapor deposition layer is an aluminum oxide vapor deposition film.

11. The packaging material according to claim 1, wherein the substrate layer includes a biaxially stretched polyethylene terephthalate film.

12. The packaging material according to claim 1, wherein 3-glycidoxypropyltrimethoxysilane is present in the silane coupling agent.

* * * * *